United States Patent
Nihei

(10) Patent No.: US 8,564,176 B2
(45) Date of Patent: Oct. 22, 2013

(54) PIEZOELECTRIC MEMS SWITCH AND METHOD OF MANUFACTURING PIEZOELECTRIC MEMS SWITCH

(75) Inventor: Yasukazu Nihei, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 304 days.

(21) Appl. No.: 12/962,821

(22) Filed: Dec. 8, 2010

(65) Prior Publication Data

US 2011/0148255 A1 Jun. 23, 2011

(30) Foreign Application Priority Data

Dec. 17, 2009 (JP) ................. 2009-286605

(51) Int. Cl.
*H01L 41/09* (2006.01)
*H01H 57/00* (2006.01)
(52) U.S. Cl.
CPC ........... *H01L 41/0926* (2013.01); *H01H 57/00* (2013.01); *H01H 2057/006* (2013.01)
USPC .......................................... 310/330; 310/328
(58) Field of Classification Search
CPC . H01L 41/09; H01L 41/0926; H01L 41/0933; H01L 41/0973; H01H 57/00; H01H 2057/00; H01H 2057/006
USPC .......................................... 310/328, 330–332
See application file for complete search history.

(56) References Cited

U.S. PATENT DOCUMENTS

| 4,620,124 A | 10/1986 | Farrall et al. |
| 2005/0194867 A1* | 9/2005 | Kawakubo et al. ........... 310/348 |
| 2007/0134835 A1 | 6/2007 | Fukuda et al. |

FOREIGN PATENT DOCUMENTS

| JP | 61-156618 A | 7/1986 |
| JP | 2006-221956 A | 8/2006 |
| JP | 2007-157511 A | 6/2007 |
| WO | WO 2004/019362 A1 | 3/2004 |

* cited by examiner

*Primary Examiner* — Derek Rosenau
(74) *Attorney, Agent, or Firm* — Birch, Stewart, Kolasch & Birch, LLP

(57) ABSTRACT

A piezoelectric MEMS switch includes: a base substrate; a diaphragm arranged to oppose the base substrate via a gap; a first piezoelectric drive section constituted by layering a first lower electrode, a first piezoelectric body and a first upper electrode on a first surface of the diaphragm, the first surface being across the diaphragm from the gap; a second piezoelectric drive section constituted by layering a second lower electrode, a second piezoelectric body and a second upper electrode on a second surface of the diaphragm, the second surface facing the gap; a fixed electrode provided on a gap side of the base substrate; and a movable electrode which is fixed to a second piezoelectric drive section side of the diaphragm and opposes the fixed electrode in such a manner that the movable electrode makes contact with and separates from the fixed electrode according to displacement of the diaphragm.

8 Claims, 6 Drawing Sheets

FIG. 4A FRONT SURFACE PIEZOELECTRIC DRIVING
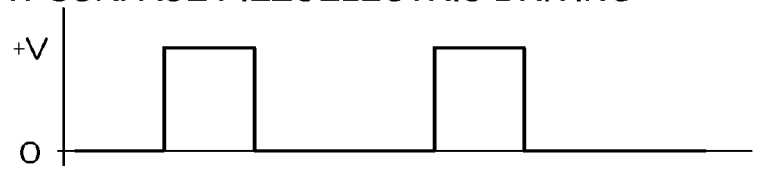
FIG. 4B REAR SURFACE PIEZOELECTRIC DRIVING
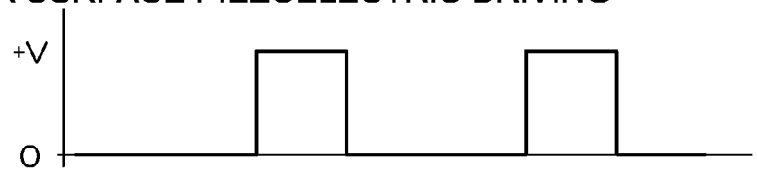
FIG. 4C SWITCH CURRENT
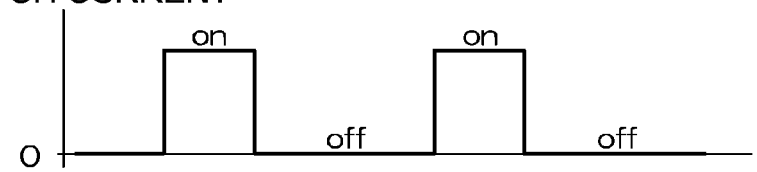
FIG. 5
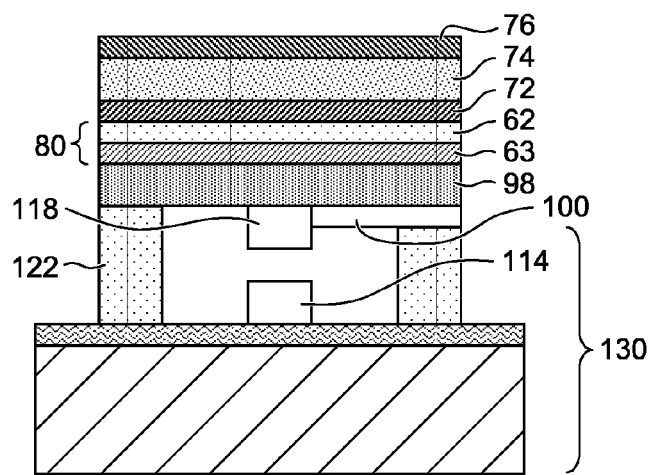

FIG. 6A FRONT SURFACE PIEZOELECTRIC DRIVING
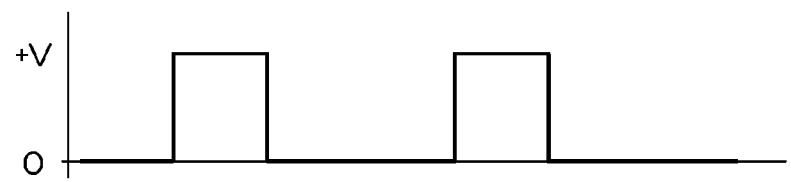
FIG. 6B SWITCH CURRENT
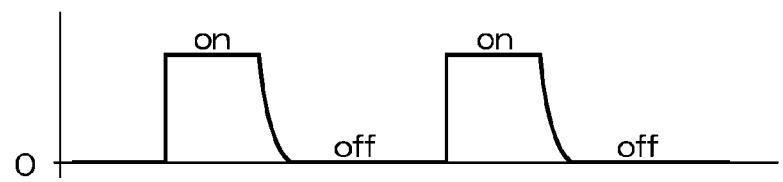

PIEZOELECTRIC MEMS SWITCH AND METHOD OF MANUFACTURING PIEZOELECTRIC MEMS SWITCH

BACKGROUND OF THE INVENTION

1. Field of the Invention

The present invention relates to a micro electro mechanical system (MEMS) switch, and more particularly to a MEMS switch having a piezoelectric drive system using a piezoelectric body thin film, and to a method of manufacturing same.

2. Description of the Related Art

In recent years, there has been extensive research and development of micro electro mechanism systems (MEMS) applied to semiconductor manufacturing processes, and switch structures of various types have been proposed in the field of MEMS switches, which is one example of the application of MEMS technology (see, for example, International Publication No. WO 2004/019362 A1 and Japanese Patent Application Publication No. 2007-157511).

International Publication No. WO 2004/019362 A1 proposes a structure in which a plurality of actuator fingers having alternately arranged positive and negative electrodes are provided as a drive source on a surface of a movable membrane, and on/off switching operation of a switch is produced by causing the membrane to deform by means of the electrostatic force of attraction between these electrodes. Furthermore, International Publication No. WO 2004/019362 A1 proposes a composition in which a group of electrodes is also disposed on the rear surface side of the membrane in order to perform compulsory driving in a switching off operation, and also proposes a composition in which a piezoelectric material is filled in between the electrodes instead of an air gap therebetween.

Japanese Patent Application Publication No. 2007-157511 discloses a structure in which a voltage is applied between a first switch drive electrode disposed on a substrate and a second switch drive electrode provided on a diaphragm which is disposed on the substrate via a cavity (gap), and the diaphragm is caused to bend by the electrostatic force of attraction generated between the electrodes, whereby a charge accumulating electrode and the first switch drive electrode make contact with each other via a tunnel insulating film.

However, MEMS switches using piezoelectric methods which have been proposed in the related art entail the following:

(1) Decline in High-Speed Response Due to Accumulation of Drive Charge and Dielectric Loss (Sticking Phenomenon)

In the case of a switching operation by attraction or repulsion due to electrostatic force, it becomes impossible to follow high-speed on/off driving in a high-frequency range, due to accumulation of charge in the piezoelectric bodies which are adjacent to the electrodes. Further, there is a possibility of not being able to follow high-speed on/off driving in a high-frequency range due to dielectric loss of the adjacent piezoelectric bodies in the high-frequency range.

(2) Time-Dependent Sticking Phenomenon of Electrostatically Attracted Contacts

In the case of a switching operation by means of attraction and repulsion due to electrostatic force, in order to guarantee a reliable on/off switching operation, it is necessary to increase the attraction distance (air gap) and raise the drive voltage during attraction, as far as possible. In this case, a sticking phenomenon is liable to occur in the attracted contact portion. The "sticking phenomenon" referred to here is phenomenon of adherence which is not intended and which causes the contact to become stuck permanently.

(3) Power Consumption of Drive Circuit, Cost of Circuit, and Size of Circuit

In the case of miniature devices such as mobile devices in particular, the circuitry of the drive system must be kept simple, but with a related-art electrostatic drive system, it has been necessary to raise the drive voltage and therefore power consumption has become large. Moreover, the drive circuit in a case of a driving operation by attraction and repulsion based on electrostatic force is required to correspond to both positive and negative voltage drivings, and the extent to which costs and circuit size can be reduced is limited because a drive circuit such as a drive IC has to be compatible with positive and negative voltages.

In response to the above, the present inventor has investigated MEMS switches using piezoelectric drive methods and has discovered technical issues of the following kind.

[1] Switch Contact Faults Due to Warping when Forming a Thin Film on a Membrane Diaphragm When a piezoelectric thin film is formed directly on a membrane, then although it depends on the size of the membrane, there is a possibility that the membrane diaphragm portion is warped by the stress in the piezoelectric film. If the amount of warping is uniform, then warping can be corrected by means of the set drive voltage, and the like, but if the amount of warping is not uniform, then it can lead to contact faults in the switch contacts, and reliable on/off operation cannot be guaranteed.

[2] Reliability in Switching Off Operation

If a piezoelectric film is formed on one side of a membrane and the membrane is caused to bend by applying a voltage to turn the switch on, whereas the drive voltage to the piezoelectric body is halted to turn the switch off, the switching off operation being performed on the basis of the spring force of the membrane (a force which seeks to return the membrane to its original state), then it is difficult to guarantee reliable separation of the contact. Moreover, there is also a possibility that high-speed response becomes poor.

In the case of a piezoelectric film, it is also possible to perform a driving in the opposite direction by applying an opposite voltage, but in general, driving in the opposite direction cannot be performed unless the applied voltage is equal to or less than the coercive voltage of the piezoelectric body. Supposing that a voltage equal to or greater than the coercive voltage is applied, then reversal of the polarization of the piezoelectric body occurs and the body is actually driven so as to be displaced in the forward direction again. Consequently, there is little margin for generating a large force in the opposite direction by applying a large voltage in order to guarantee reliable separation of the contact.

[3] Increased Costs of Drive Control System by Opposite Potential Driving for the Purpose of Forced Separation when Switching Off Furthermore, in order to apply a potential in the opposite direction, it is necessary to design a drive circuit to be compatible with positive and negative voltages, and therefore the costs and size of the drive circuit, such as a drive IC, are increased.

SUMMARY OF THE INVENTION

The present invention has been contrived with the foregoing in view, an object thereof being to provide a piezoelectric MEMS switch and a method of manufacturing a piezoelectric MEMS switch whereby the aforementioned technical problems can be eliminated.

The following modes of the invention are offered in order to achieve the aforementioned object.

In order to attain an object described above, one aspect of the present invention is directed to a piezoelectric MEMS switch comprising: a base substrate; a diaphragm arranged to oppose the base substrate via a gap; a first piezoelectric drive section constituted by layering a first lower electrode, a first piezoelectric body and a first upper electrode on a first surface of the diaphragm, the first surface being across the diaphragm from the gap; a second piezoelectric drive section constituted by layering a second lower electrode, a second piezoelectric body and a second upper electrode on a second surface of the diaphragm, the second surface facing the gap; a fixed electrode provided on a gap side of the base substrate; and a movable electrode which is fixed to a second piezoelectric drive section side of the diaphragm and opposes the fixed electrode in such a manner that the movable electrode makes contact with and separates from the fixed electrode according to displacement of the diaphragm.

According to this aspect of the invention, a first piezoelectric drive section and a second piezoelectric drive section are provided on the front and rear surfaces of a diaphragm (a first face and a second face), as drive sources for causing a movable electrode to contact with and separate from a fixed electrode provided on a base substrate, and both the operation of connecting the contact (switching on operation) and the operation of separating the contact (switching off operation) are carried out by causing the diaphragm to move by motive force generated by these drive sources. Therefore, a reliable switching on and off operations are guaranteed.

Desirably, the first piezoelectric body and the second piezoelectric body are piezoelectric thin films deposited by a thin film forming method.

From the viewpoint of reducing warping of the diaphragm in the manufacturing stage, it is desirable to use a thin film forming method. Apart from physical vapor phase deposition (PVD), of which sputtering is a typical example, the thin film forming method may be chemical vapor phase deposition (CVD), liquid phase deposition, or the like.

Sputtering is especially desirable because of being capable of forming a film at low temperature in order to reduce thermal stress, as well as enabling the formation of a thick film having a thickness of several μm or more, which produce high drive torque.

Desirably, a switching-on operation of displacing the diaphragm in a direction towards the base substrate so as to cause the movable electrode to make contact with the fixed electrode is performed by applying a first voltage between the first lower electrode and the first upper electrode; and a switching-off operation of displacing the diaphragm in an opposite direction to the base substrate so as to cause the movable electrode to separate from the fixed electrode is performed by applying a second voltage between the second lower electrode and the second upper electrode.

According to this aspect of the invention, the first piezoelectric drive section is driven in a switching on operation, thereby causing the diaphragm to approach the base substrate, and the second piezoelectric drive section is driven in a switching off operation, thereby causing the diaphragm to separate from the base substrate.

Desirably, the first voltage which is applied in the switching-on operation and the second voltage which is applied in the switching-off operation are voltages of a same sign.

According to this aspect of the invention, it is possible to reduce the circuit cost and circuit size in comparison with a case where a drive circuit compatible with positive and negative voltage driving is used.

Desirably, the first voltage which is applied in the switching-on operation and the second voltage which is applied in the switching-off operation are both positive voltages.

In particular, by adopting a drive system based on positive voltage, it is possible to achieve further reductions in cost and size.

Desirably, the diaphragm is supported by a dual-support diaphragm structure in which both end portions of a movable region are fixed to a supporting member.

According to this aspect of the invention, there is little mechanical deterioration and deformation over time, and decline in strength due to material fatigue, and the like, compared to a cantilever beam structure, and therefore a switch element of high reliability can be achieved.

In order to attain an object described above, another aspect of the present invention is directed to a method of manufacturing a piezoelectric MEMS switch, comprising the steps of: forming a thin film of a first piezoelectric body on a first lower electrode by a thin film forming method, the first lower electrode being formed on a SOI substrate; forming a first upper electrode on the thin film of the first piezoelectric body formed on the SOI substrate; bonding a sacrificial substrate onto a first upper electrode side of the SOI substrate; forming a diaphragm by removing a silicon (Si) layer that is exposed on a rear surface side of the SOI substrate onto which the sacrificial substrate has been bonded, by etching, so as to reduce thickness of the SOI substrate to a silicon dioxide ($SiO_2$) layer; forming a second lower electrode on the silicon dioxide ($SiO_2$) layer which forms the diaphragm; forming a thin film of a second piezoelectric body by sputtering on the second lower electrode; forming a second upper electrode on the second piezoelectric body; forming an insulating layer on the second upper electrode; forming a movable electrode which is to become a movable contact for switching, on the insulating layer; forming, separately from a layered structure including respective layers from the sacrificial substrate to the movable electrode formed in the above steps, a silicon (Si) structure in which a fixed electrode is formed on a silicon (Si) substrate which is to become a base substrate, and bonding the layered structure to the silicon (Si) structure in such a manner that the movable electrode of the layered structure opposes the fixed electrode of the silicon (Si) structure via a gap; and removing the sacrificial substrate after the layered structure has been bonded to the silicon (Si) structure.

When this method of manufacture is used, it is possible to carry out the steps of forming a piezoelectric thin film and piezoelectric drive electrodes (lower electrode and upper electrode) on the front and rear surfaces of the diaphragm in a flat wafer state, and the patterning step can be accomplished readily. Moreover, it is also possible to design and form the lead wires extracted from the front and rear surfaces, readily, by lithography.

A SOI substrate with an electrode here includes the first lower electrode formed on the SOI substrate.

In order to attain an object described above, another aspect of the present invention is directed to A method of manufacturing a piezoelectric MEMS switch, comprising the steps of: forming a thin film of a first piezoelectric body on a first lower electrode by a thin film forming method, the first lower electrode being formed on a SOI substrate; forming a first upper electrode on the thin film of the first piezoelectric body formed on the SOI substrate; etching subsequently a portion of a silicon (Si) layer which is exposed on a rear surface side of the SOI substrate, to a silicon dioxide ($SiO_2$) layer, so as to form a recess section and form a diaphragm having a diaphragm structure in a region of the silicon dioxide ($SiO_2$) layer which is exposed in the recess section; forming a second lower electrode on the silicon dioxide (SiO$_2$) layer in the recess section; forming a thin film of a second piezoelectric body by a thin film forming method on the second lower electrode; forming a second upper electrode on the second piezoelectric body; forming an insulating layer on the second upper electrode; forming a movable electrode which is to become a movable contact for switching, on the insulating layer; and preparing, separately from a layered structure including respective layers from the first upper electrode to the movable electrode formed in the above steps, a silicon (Si) structure in which a fixed electrode is formed on a silicon (Si) substrate which is to become a base substrate, and bonding the layered structure to the silicon (Si) structure in such a manner that the movable electrode of the layered structure opposes the fixed electrode of the silicon (Si) structure via a gap.

According to this aspect of the invention, a characteristic of using this method of manufacture is that since the membrane structure which is a dual-support diaphragm structure can be formed monolithically without a bonding step, then excellent driving durability is achieved. Although the drive electrode wiring on the rear surface side has a three-dimensional wiring structure and involves a complicated process, this method is desirable in cases where high drive reliability is demanded.

A SOI substrate with an electrode here includes the first lower electrode formed on the SOI substrate.

Desirably, the recess section has a tapered side face such that opening area of the recess section becomes gradually smaller from a lower surface of the silicon (Si) layer toward the silicon dioxide (SiO$_2$) layer.

According to this aspect of the invention, respective lead electrode patterns for the second lower electrode and the second upper electrode can be formed readily by using the inclined surfaces of the recess section.

Desirably, the first piezoelectric body and the second piezoelectric body are formed to have a same film thickness.

According to this aspect of the invention, it is possible to reduce warping of the diaphragm in the manufacturing stage, and the reliability of the switching on and off operations is improved.

According to the present invention, by using a piezoelectric drive method as a drive source for performing contacting and separating operations of a switch contact, and adopting a composition in which piezoelectric drive sections are provided on both the front and rear surfaces of a diaphragm, it is possible to achieve better high-frequency response (tracking: following capability) compared to a conventional electrostatic method, and it is also possible to exert a strong drive force in the return direction of the diaphragm (membrane) during a switching off operation. Therefore, it is possible to reduce fixing and sticking phenomena of the contact.

Furthermore, according to the present invention, since piezoelectric films are formed on both surfaces of a diaphragm, then it is possible to reduce warping of the substrate upon manufacture (initial warping). Therefore, reliable switching on and off operations are possible and improvement in reliability can be achieved.

Moreover, according to the present invention, since an attracting operation and a returning operation of the diaphragm can be driven by potentials of the same sign (for example, by positive potential only), then it is possible to simplify the drive IC circuitry and reduce the cost.

BRIEF DESCRIPTION OF THE DRAWINGS

A preferred embodiment of this invention as well as other objects and benefits thereof, will be explained in the following with reference to the accompanying drawings, in which like reference characters designate the same or similar parts throughout the figures and wherein:

FIGS. 4A to 4C are waveform diagrams showing the behavior of a drive voltage waveform and a switch current;

FIG. 5 is a schematic drawing of a MEMS switch manufactured as a comparative example;

FIGS. 6A and 6B are waveform diagrams showing the behavior of a drive voltage waveform and a switch current in the comparative example.

DETAILED DESCRIPTION OF THE PREFERRED EMBODIMENTS

Structure of Piezoelectric MEMS Switch

Figure 1A:
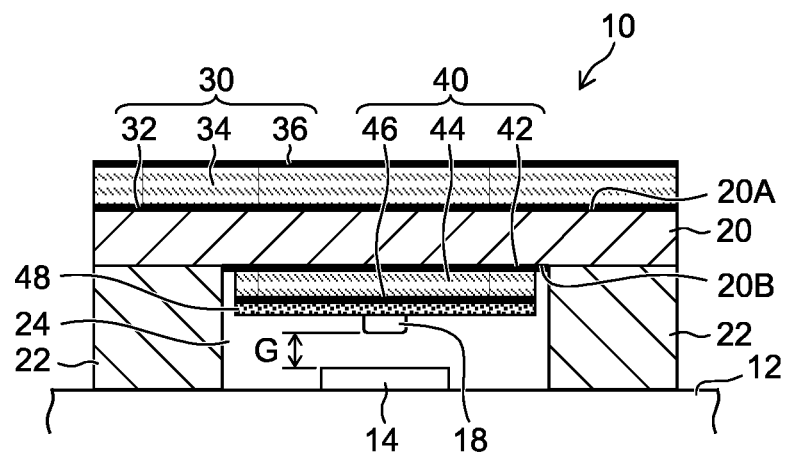
FIGS. 1A and 1B are cross-sectional diagrams showing the structure of a piezoelectric MEMS switch relating to an embodiment of the present invention.
Figure 1B:
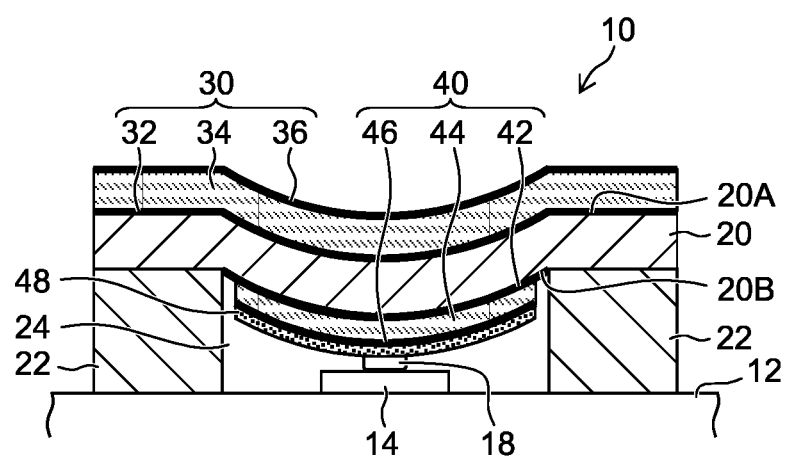

FIGS. 1A and 1B are cross-sectional diagrams showing the structure of a MEMS switch based on a piezoelectric drive system relating to an embodiment of the present invention. In this MEMS switch 10 (corresponding to a "piezoelectric MEMS switch"), a fixed electrode (fixed contact) 14 is disposed on a base substrate 12, and the switch is turned on and off by causing a movable electrode (movable contact) 18 for switching, which is provided opposing the fixed electrode 14, to contact with and separate from the fixed electrode 14. In FIGS. 1A and 1B, only one switch element is depicted, but it is possible to form a plurality of similar switch elements on the base substrate 12.

A diaphragm 20 on which the movable electrode 18 is provided is supported by a supporting member 22, and is disposed so as to oppose the base substrate 12 via a gap (cavity) 24. By adopting a structure in which the supporting member 22 is interposed between the diaphragm 20 and the base substrate 12, a gap 24 is formed between the base substrate 12 and the diaphragm 20, and a gap (air gap) G of a prescribed size is formed between the movable electrode 18 and the fixed electrode 14.

The diaphragm 20 according to the present example has a diaphragm structure (membrane structure) employing a dual support structure in which both ends of the displaceable region (the movable region) are fixed (constricted) by the supporting member 22. The diaphragm 20 and the supporting member 22 may be composed respectively by separate members, these members being joined together, or alternatively the diaphragm 20 and the supporting member 22 may be composed as a single member (component) formed as a united body. The structure is not limited to a diaphragm structure in which the whole periphery of the movable region of the diaphragm 20 is constricted by the supporting member 22, and it is also possible to employ a beam support structure in which only respective end portions which are mutually opposing on either side of the movable region are constricted by the supporting member 22.

The MEMS switch 10 relating to the present embodiment includes piezoelectric drive sections (30, 40) on the front and rear surfaces of the diaphragm 20, as drive sources which cause displacement of the diaphragm 20. In other words, lower electrodes (32, 42), piezoelectric bodies (34, 44) and upper electrodes (36, 46) are respectively disposed in a stacked structure on the front surface 20A of the diaphragm 20 (the upper surface in FIGS. 1A and 1B, which corresponds to a "first surface") and on the rear surface 20B of the diaphragm 20 (the lower surface in FIGS. 1A and 1B, which corresponds to a "second surface").

Respective layers forming a first lower electrode 32, a first piezoelectric body 34 and a first upper electrode 36 are layered successively on the front surface 20A on the upper side of the diaphragm 20, and a first piezoelectric drive unit 30 is constituted by the layered structure composed of the first piezoelectric body 34 interposed between the electrodes (32 and 36). When a potential difference (voltage) is applied between the first lower electrode 32 and the first upper electrode 36, the first piezoelectric body 34 which is interposed between these electrodes deforms. Since the first lower electrode 32 is fixed to the diaphragm 20, the diaphragm 20 bends downwards in FIGS. 1A and 1B (in a downwardly protruding shape) due to a compressive stress in the lateral direction (planar direction) which acts on the first piezoelectric body 34, which is constricted (fixed) on top of the diaphragm 20. In this way, by adopting a composition in which a first piezoelectric drive section 30 is disposed on top of the diaphragm 20, a unimorph type piezoelectric actuator is formed which operates on the basis of d31 mode piezoelectric distortion.

On the rear surface side of the diaphragm 20, in a similar fashion, respective layers forming a second lower electrode 42, a second piezoelectric body 44 and a second upper electrode 46 are layered in sequence from the rear surface 20B in the downward direction in FIGS. 1A and 1B. A second piezoelectric drive unit 40 is constituted by the layered structure composed by the second piezoelectric body 44 interposed between the electrodes (42, 46). Furthermore, a movable electrode 18 is provided via an insulating film 48 on top of the second upper electrode 46 (the lower surface in FIGS. 1A and 1B). This movable electrode 18 constitutes a switching contact section, as described previously.

In FIGS. 1A and 1B, a layered structure is adopted in which a second lower electrode 42 is formed on the lower surface of the diaphragm 20, a second piezoelectric body 44 is formed on the lower surface of the second lower electrode 42, and a second upper electrode 46 is formed on the lower surface of the second piezoelectric body 44. The meaning of the terms "upper" and "lower" differ from the description of FIGS. 1A and 1B. This nomenclature focuses on the common nature of the functions of the members (elements), due to the symmetrical relationship between the first piezoelectric drive section 30 and the second piezoelectric drive section 40 which are disposed in upper and lower positions on either side of the diaphragm 20. In order to simplify the description, the expressions "upper" and "lower" are used, but these terms should not be interpreted as being restricted to the vertical direction of the MEMS switch 10 shown in FIGS. 1A and 1B, but rather should be interpreted rationally without departing from the technical idea of the present application in cases where the attitude of the MEMS switch 10 is changed or the direction of observation is changed.

If compressive stress in the planar direction (lateral direction) occurs in the second piezoelectric body 44 due to application of a drive voltage between the electrodes (42 and 46) which are disposed on the rear surface 20B of the diaphragm 20, then the diaphragm 20 bends in the upward direction in FIGS. 1A and 1B (to assume an upwardly projecting shape). In this way, by adopting a composition where the second piezoelectric drive section 40 is disposed on top of the diaphragm 20 (on the lower surface of the diaphragm 20 in FIGS. 1A and 1B), a unimorph type piezoelectric actuator which operates in d31 mode is formed.

Due to having a structure in which a first piezoelectric drive section 30 and a second piezoelectric drive section 40 are arranged respectively in upper and lower positions on either side of a common diaphragm 20, the MEMS switch 10 according to the present embodiment is able to displace the diaphragm 20 in both the downward direction and the upward direction by means of a strong piezoelectric driving force which is produced by the respective piezoelectric drive sections (30, 40).

Piezoelectric Film

The first piezoelectric body 34 and the second piezoelectric body 44 in the present embodiment are both formed by a thin film forming method (a thin film forming process), which is typically a sputtering method. It is also possible to employ vapor deposition or CVD, or the like, instead of sputtering, for the thin film forming method. By employing a thin film forming method, the grinding step and polarization processing step used when forming layers by sintering powder, for instance, are not required and therefore manufacture is simplified.

Furthermore, by forming piezoelectric films (a first piezoelectric body 34 and a second piezoelectric body 44) with substantially equal film thickness on both the front and rear surfaces of the diaphragm 20 by a thin film forming method, it is possible to suppress warping of the diaphragm 20. From the viewpoint of preventing warping, especially in cases where the first piezoelectric body 34 and the second piezoelectric body 44 are formed by the same piezoelectric material (composition), it is desirable for the piezoelectric films on the front and rear surfaces to have the same thickness, as described above, but if the whole of the diaphragm including the front and rear surface piezoelectric films becomes thick, then there is a concern that the diaphragm will become less liable to be displaced by piezoelectric driving.

It is also possible to employ a composition in which the piezoelectric film on the rear surface side is made thinner than that on the front surface side, for reasons such as the facts that the main operation of the switch element is an on-operation, and the piezoelectric film on the rear surface side for driving separation of the contact has an auxiliary role and is provided with the main purpose of improving reliability of the switch off operation (ensuring separation). However, if the thickness of the piezoelectric film is different on the front and rear surfaces of the diaphragm, then the warping occurs due to the difference in stress at the front and rear surfaces, and therefore from the viewpoint of reducing warping of this kind, it is desirable to match the stresses on either surface as far as possible by a method such as varying the composition of the piezoelectric material or varying the film formation conditions between the front and rear surfaces of the diaphragm, or the like.

To give an example of a specific method, it is possible to control stress by finely adjusting (by several %) the amount of lead of the three components of lead, zirconia and titanium.

Switching on Operation

In the MEMS switch 10 having the composition described above, the diaphragm 20 is displaced in the downward direction in FIGS. 1A and 1B by applying a prescribed potential difference (corresponding to a "first voltage") between the first lower electrode 32 and the first upper electrode 36, and the movable electrode 18 thereby makes contact with the fixed electrode 14. By driving the first piezoelectric drive section 30 in this way and performing an operation of attracting the diaphragm 20 to the base substrate 12, the movable electrode 18 and the fixed electrode 14 become electrically connected and the switch assumes an on (contact closed) state (see FIG. 1B).

When setting the switch to an off (contact open) state from the on state described above, the application of voltage to the first piezoelectric drive section 30 is terminated and a voltage is applied to the second piezoelectric drive section 40. More specifically, a prescribed potential difference (corresponding to a "second voltage") is applied between the second lower electrode 42 and the second upper electrode 46, and the diaphragm 20 is displaced in the upward direction in FIGS. 1A and 1B. By driving the second piezoelectric drive section 40 and performing an operation of pulling the diaphragm 20 away from the base substrate 12 in this way, the movable electrode 18 is separated forcibly from the fixed electrode 14 and the switch assumes an off (contact open) state.

According to the MEMS switch 10 of the present embodiment, in both a switching on operation and a switching off operation, it is possible to apply a strong motive force (torque) to the diaphragm 20 by means of the first piezoelectric drive section 30 or the second piezoelectric drive section 40. By this means, it is possible to perform the dependable on and off switching, and hence the switch having high reliability can be achieved.

Polarity of Drive Voltage

The respective piezoelectric layers of the first piezoelectric body 34 and the second piezoelectric body 44 are polarized in a direction perpendicular to the layer surface, and the relationship between the sign of the drive voltage (potential) and the direction of displacement of the diaphragm 20 is governed by the direction of polarization.

Desirably, the drive voltage applied in order to drive the first piezoelectric drive section 30 (corresponding to the "first voltage") and the drive voltage applied in order to drive the second piezoelectric drive unit 40 (corresponding to the "second voltage") are voltages of the same sign.

By adopting a composition in which the first piezoelectric drive section 30 and the second piezoelectric drive section 40 are driven by potentials of the same polarity, either positive or negative polarity, then it is possible to reduce the cost of the drive circuit (drive IC) and achieve reduction of the circuit size (scale), compared to a composition where drive voltages of both positive and negative polarity are used.

Although it is also possible to adopt a composition where the driving is performed by positive voltage only or performed by negative voltage only, a composition in which the driving is performed by positive voltage is especially desirable. This is because circuits which operate with positive voltage are commonly used, whereas negative ICs (integrated circuits) are larger in size than positively driven circuits.

First Practical Example of Method of Manufacturing MEMS Switch

Next, the processing of manufacturing a MEMS switch relating to an embodiment of the present invention will be described with reference to a specific example. FIGS. 2A to 2E and FIGS. 3A to 3C are step diagrams showing a manufacturing process relating to a first practical example.

(Step 1)

Figure 2A:
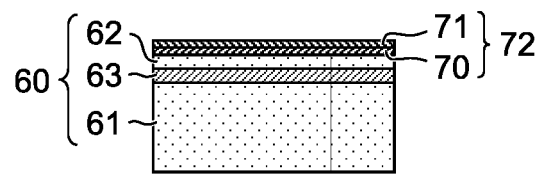
FIGS. 2A to 2E and FIGS. 3A to 3C are step diagrams showing a manufacturing process for a piezoelectric MEMS switch according to a first practical example.

Firstly, as a substrate for film formation, a substrate with electrode was prepared by successively layering a 30 nm-thick Ti contact layer 70 and a 150 nm-thick Pt lower electrode 71 onto a SOI (Silicon On Insulator) substrate 60 (see FIG. 2A). The SOI substrate 60 has a structure in which an oxide film layer ($SiO_2$ layer) 63 is interposed between silicon (Si) layers 61 and 62. A lower electrode 72 (corresponding to a "first lower electrode") is constituted by the layered structure of the Ti contact layer 70 and the Pt lower electrode 71.

(Step 2)

Figure 2B:
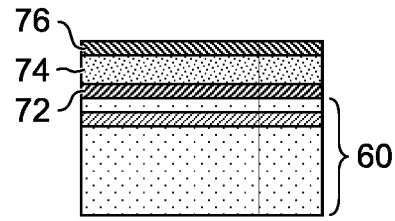

Thereupon, a 5 μm-thick PZT piezoelectric film 74 (corresponding to a "first piezoelectric body") was formed by a high-frequency (RF) sputtering apparatus using a $Pb_{1.3}Zr_{0.52}Ti_{0.48}O_3$ target (see FIG. 2B). The film forming conditions were as described below.

Substrate temperature: 525° C.
Voltage applied to target: 2.5 W/cm²
Substrate-to-target distance: 60 mm
Degree of vacuum: 0.5 Pa
Film forming gas: $Ar/O_2$ mixed gas ($O_2$ partial pressure: 1.3 mol %)

(Step 3)

Thereupon, the upper electrode 76 (corresponding to a "first upper electrode") was patterned by a standard photolithography (see FIG. 2B). The upper electrode 76 has a layered structure composed of a 50 nm-thick Ti layer and a 200 nm-thick Pt layer.

(Step 4)

Figure 2C:
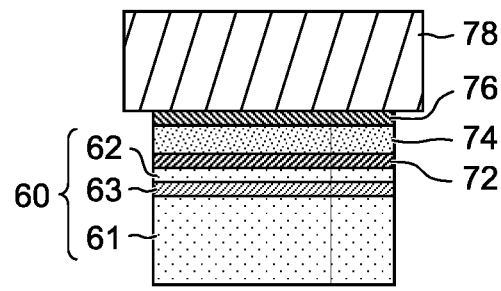

Thereupon, a silicon (Si) sacrificial substrate 78 was pressure bonded directly onto the upper electrode 76 side of the SOI substrate 60 (FIG. 2C). This sacrificial substrate 78 was bonded in order to facilitate handling. Bonding by means of adhesive is also possible for bonding the sacrificial substrate 78. However, in the present example, a high-temperature process was employed in which the substrate temperature was set to 525° C. during film formation, and therefore a direct bonding method between the electrode and silicon which does not use adhesive was adopted. In the case of a process where the film formation temperature is 300° C. or less, it is possible to use an organic high temperature-compatible adhesive, such as a polyimide adhesive.

(Step 5)

Figure 2D:
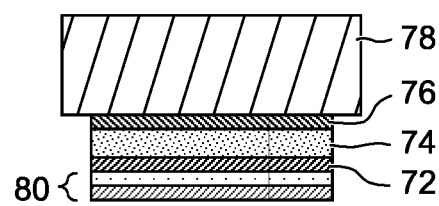

Thereupon, the Si layer 61 was removed by reactive ion etching of the rear surface side of the SOI substrate 60 (see FIG. 2D). A buried oxide film ($SiO_2$ layer) 63 of the SOI substrate 60 formed a stop layer which stopped the etching. Dry etching is generally employed, but wet etching is also possible.

By etching the Si layer 61 of the SOI substrate 60 up to the $SiO_2$ layer 63 to form the SOI substrate 60 into a thin layer, a diaphragm 80 was formed by the remaining $SiO_2$ layer 63 and the silicon layer 62 thereon. In the present example, the thickness of the diaphragm 80 was approximately 10 μm.

(Step 6)

Figure 2E:
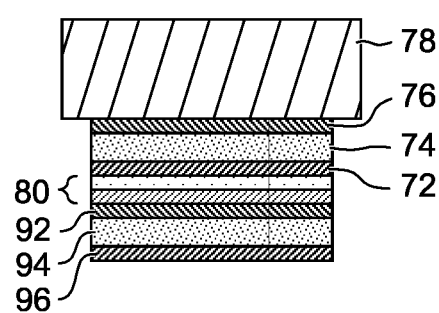

A rear lower electrode 92 (corresponding to a "second lower electrode"), a PZT piezoelectric film 94 (corresponding to a "second piezoelectric body"), and a rear upper electrode 96 (corresponding to a "second upper electrode") were formed on the rear surface side of the diaphragm 80, similarly to the front surface side (see FIG. 2E).

The design specifications, such as the material type and thickness, and the like, relating to both the electrodes (92, 96) and the piezoelectric film 94 were the same as those of the forming steps on the front side which are described above with reference to steps 1 to 3. It was confirmed that improvement was achieved in the warping initially observed in the substrate of the diaphragm 80, by forming electrodes (92, 96) and a piezoelectric body (94) of the same specifications as the front side, on the rear surface of the diaphragm 80.

(Step 7)

Figure 3A:
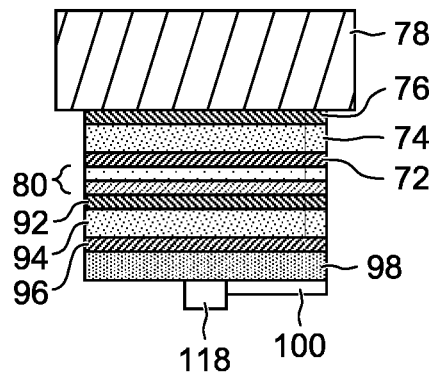

Thereupon, as shown in FIG. 3A, an insulating layer 98 was formed on the lower surface of the rear upper electrode 96 and furthermore a switch wiring electrode 100 and a movable electrode (contact electrode) 118 were formed on the lower surface of the insulating layer 98.

The insulating layer 98 may be a polymer material such as polyimide, or may be an inorganic film of $SiO_2$ or the like. However, in order not to reduce the displacement of the membrane (displacement of the diaphragm 20), it is desirable for the insulating layer 98 to have a small thickness, and desirably the insulating layer 98 is made of a flexible material which is not liable to cracking, or the like.

For example, when a photosensitive polyimide was used, then the thickness of the insulating layer 98 was set to approximately 3 µm, and when $SiO_2$ was used, then the thickness thereof was set to approximately 500 nm.

(Step 8)

Figure 3B:
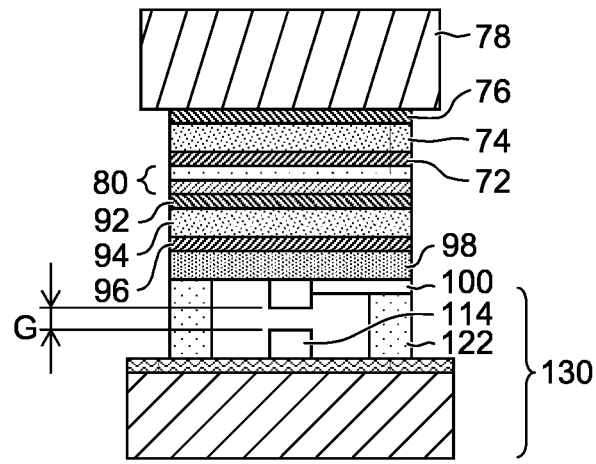

In a separate process from the steps 1 to 7 described above, a silicon (Si) substrate was etched in advance to fabricate a Si structure 130 having a portion that was to form a supporting member 122, a fixed electrode 114, and a switch circuit including necessary wiring electrodes; the layered structure 140 obtained by steps 1 to 7 and the Si structure 130 were bonded together with an adhesive to create a membrane switch structure (see FIG. 3B). In the present embodiment, the height of the membrane structure (switch contact distance G) was set to 5 µm.

(Step 9)

Figure 3C:
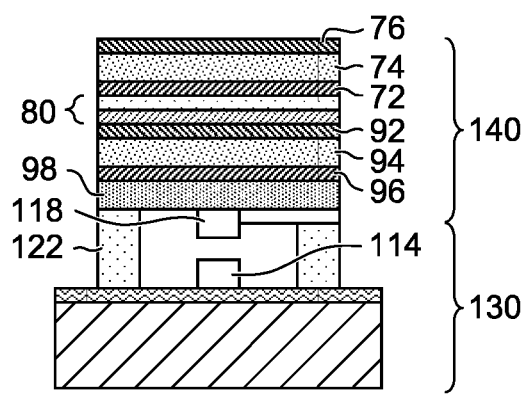

Thereupon, the sacrificial substrate 78 was removed (see FIG. 3C).

Verification of Operation of MEMS Switch

The switching operation of the element obtained by the manufacturing process of the first practical example shown in FIGS. 2A to 2E and FIGS. 3A to 3C was evaluated. When a drive voltage 10 V was applied to the piezoelectric film 74 on the front side of the diaphragm 80, the switch contact established a connection and the switching on operation was verified. Furthermore, by applying a drive voltage of 5 V to 10 V to the piezoelectric film 94 on the rear surface side during the off phase, the switch contact was separated and a reliable off operation was verified.

FIGS. 4A to 4C are waveform diagrams showing the relationship between the drive voltage waveform and the switching operation. FIG. 4A shows the voltage applied to the piezoelectric film 74 on the front side of the diaphragm 80 (the drive voltage in front surface piezoelectric driving), and FIG. 4B shows the voltage applied to the piezoelectric film 94 on the rear side of the diaphragm 80 (the drive voltage in rear surface piezoelectric driving). The horizontal axis represents time and the vertical axis represents the voltage value [V] with reference to the potential of the lower electrode. FIG. 4C shows the value of the switch current flowing in the circuit when the switch contact is closed (i.e. when the movable electrode 118 is in contact with the fixed electrode 114).

As shown in FIGS. 4A to 4C, at the timing at which a drive voltage is applied to the front side piezoelectric film 74, the contact closes, the switch switches on, and a switch current flows. Thereupon, by applying a drive voltage to the piezoelectric film 94 on the rear side at the timing at which the application of drive voltage to the front side piezoelectric film 74 is cancelled, the contact separates, the switch switches off, and the switch current is shut off. In this way, since a composition is adopted whereby a movable contact (the movable electrode 118) is contacted and separated by applying a torque to the diaphragm 80 in both a switching on operation and a switching off operation, by piezoelectric driving on both the front and rear sides of the diaphragm 80, then a reliable switching on and off operation is guaranteed.

In FIGS. 4A and 4B, the drive voltage in the front surface piezoelectric driving and the drive voltage in the rear surface piezoelectric driving are set to the same voltage value, but they may also be set to different voltage values. In particular, in a switching off operation, the returning force (restoring force) which seeks to return the diaphragm 80 to its original state also acts on the diaphragm 80 and therefore it is possible to set the drive voltage in rear surface piezoelectric driving to a lower voltage than the drive voltage in front surface piezoelectric driving.

Comparative Example

As a comparative example, a composition was manufactured in which a piezoelectric drive section (lower electrode 72, piezoelectric film 74, and upper electrode 76) was formed only on the upper side (one side) of a diaphragm 80, as shown in FIG. 5. In this comparative example, since a piezoelectric film 74 was formed only on one side of the diaphragm 80, then upwardly projecting warping of the diaphragm 80 was observed due to the tensile stress of the piezoelectric film in the direction perpendicular to the film thickness. Depending on the amount of warp, warping in this direction acts to prevent connection of the switch contact even when a drive voltage is applied, and it was found that the reliability of the guaranteed switching on and off operation declined markedly in this case.

Furthermore, when the drive waveform shown in FIG. 6A was applied to the piezoelectric film 74 of the switch element in FIG. 5, and the element was driven to switch off only by means of the returning force of the diaphragm 80, then cut-off of the switch current became poor, especially in the high-frequency range (see FIG. 6B).

Second Practical Example of Method of Manufacturing MEMS Switch

Next, a second practical example of processing for manufacturing a MEMS switch relating to an embodiment of the present invention will be described. The process is not limited to the manufacturing process described in relation to FIGS. 2A to 3C and it is also possible to use a process such as that described below. FIGS. 7A to 7D are step diagrams showing a manufacturing process relating to the second practical example. In FIGS. 7A to 7D, elements which are the same as or similar to the composition described in FIGS. 2A to 3H are labeled with the same reference numerals, and description thereof is omitted here.

(Step 1)

Figure 7A:
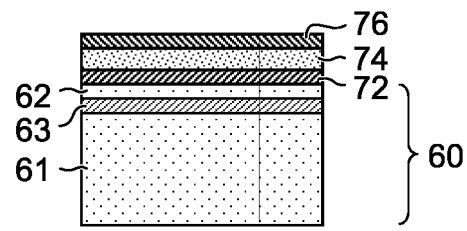
FIGS. 7A to 7D are step diagrams showing a manufacturing process for a piezoelectric MEMS switch according to a second practical example.

Firstly, as shown in FIG. 7A, a lower electrode 72, a PZT piezoelectric film 74 and an upper electrode 76 are layered onto a SOI substrate 60, by means of a similar procedure to steps 1 to 3 of the first practical example which are described above in FIGS. 2A to 2E.

(Step 2)

Figure 7B:
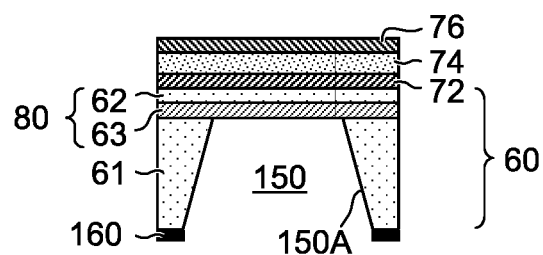
Figure 7C:
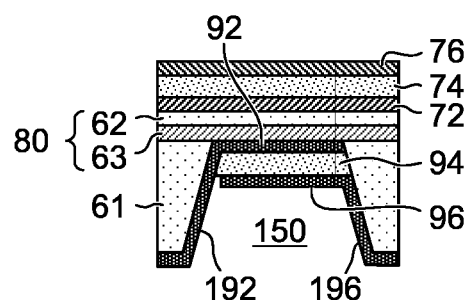

Thereupon, as shown in FIG. 7B, a recess section 150 is formed by etching (by dry etching, for example) the Si layer 61 on the lower side of the SOI substrate 60, thereby creating a membrane structure (diaphragm structure). In the etching process, the portion that is not to be removed is masked with a resist 160 and then plasma is applied. By this means, etching is performed in the opening portions of the mask pattern of the resist 160. In the present example, a buried oxide film ($SiO_2$ layer) 63 forms a stop layer and a diaphragm 80 is formed by the $SiO_2$ layer 63 which is exposed in the recess section 150 and by the silicon layer 62 on top of the $SiO_2$ layer 63.

As shown in the drawings, the recess section 150 has a tapered side face 150A whereby the opening area gradually becomes smaller from the lower surface of the silicon layer 61 toward the $SiO_2$ layer 63. Forming the inner side face of the recess section 150 as an inclined surface in this way facilitates the handling (patterning) of the wiring electrodes for extracting wires to the exterior from the inner side of the recess section 150, in a subsequent step (see FIG. 7C). The recess section 150 having the inclined side face 150A can be achieved by controlling the etching conditions and/or the shape of the mask pattern. For example, it is possible to form a recess section having an inclined surface by [1] directing plasma onto the substrate surface from an oblique direction, [2] rotating the substrate in an inclined fashion, or [3] designing the pattern shape by means of the resist 160, or by adopting a suitable combination of these approaches.

(Step 3)

Thereupon, the resist 160 is removed and a rear surface lower electrode 92, a piezoelectric film 94 (corresponding to a second piezoelectric body), and a rear surface upper electrode 96 are formed on the rear surface side of the diaphragm 80, in other words, on the inner side of the recess section 150. The wiring pattern 192 of the rear surface lower electrode 92 is formed along the left-hand oblique surface in FIG. 7C, and the wire thereof is extracted to the left-hand side in FIG. 7C. The wiring pattern 196 of the rear surface upper electrode 96 is formed along the right-hand oblique surface in FIG. 7C, and the wire thereof is extracted to the right-hand side in FIG. 7C. In this way, wiring patterns for the rear surface lower electrode 92 and the rear surface upper electrode 96 are formed in such a manner that the wires thereof are extracted in mutually distant positions alternately.

(Step 4)

Figure 7D:
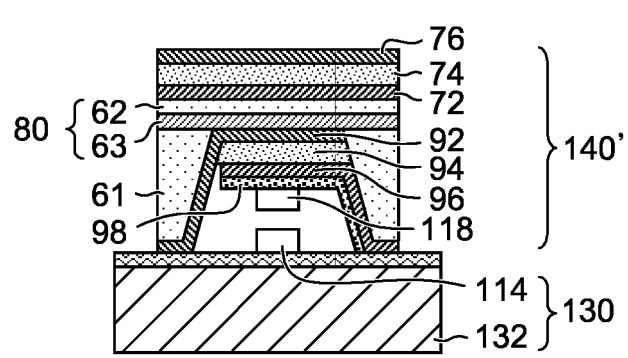

Thereupon, an insulating layer 98 is formed on the lower surface of the rear upper electrode 96 and furthermore a switch wiring electrode 100 and a movable electrode (contact electrode) 118 are formed on the lower surface of the insulating layer 98 (see FIG. 7D).

(Step 5)

Meanwhile, separately from the layered structure 140' obtained by steps 1 to 4 described above, a silicon (Si) structure 130 including a fixed electrode 114 formed on a silicon (Si) substrate 132 forming a base substrate is prepared, and the layered structure 140' and the silicon (Si) structure 130 are bonded together (see FIG. 7D).

Actions and Beneficial Effects of Embodiments of the Present Invention

According to the above-described embodiments of the present invention, the following actions and beneficial effects are obtained.

<1> By adopting a piezoelectric drive method, it is possible to achieve better compatibility with high frequency operation, compared to an electrostatic drive method, and high-speed on/off driving at high frequency is possible.

<2> Since a strong force can also be applied by piezoelectric driving in terms of the return direction when the separation of the contact of the switch is performed, then it is possible to reduce a fixing (adhering) phenomenon or sticking phenomenon of the contact. Moreover, it is also possible to separate the contact dependably in a switching off operation, and therefore a switching operation of high reliability can be guaranteed.

<3> It is possible to drive the piezoelectric drive sections on both the front and rear surfaces with electric potential of the same sign, and a circuit composition which is compatible with any one of positive voltage and negative voltage can be adopted for the drive circuit, such as a drive IC. By employing a direct current driving of this kind, it is possible to reduce the cost and the size of the circuit.

<4> By forming a piezoelectric film on both the front and rear surfaces of the diaphragm 20, it is possible to reduce warping of the diaphragm 20. By this means, contact errors, and the like, caused by warping of the substrate can be prevented and reliable switching on and off operation is guaranteed, thus improving the reliability of the switching operation.

<5> In implementing embodiments of the present invention, it is possible to adopt a mode where a cantilever beam structure is employed as the supporting structure of the diaphragm 20. However, in the case of a cantilever beam structure, since the fulcrum is on one side only, rigidity is low and it is conceivable that cases may occur where reliable switching operations cannot be guaranteed due, for instance, to temporal deterioration and deformation as a result of switching operations or decline in strength as a result of material fatigue. Therefore, a more desirable mode is one using a diaphragm having a dual support structure as described in FIGS. 1A to 7D.

Other Actions and Beneficial Effects

The embodiments described above explains merits of driving a first piezoelectric drive section 30 and a second piezoelectric drive section 40 provided on the front and rear surfaces of a diaphragm 20 using a drive voltage of the same sign, but supposing that a drive system capable of applying positive and negative potential to the first piezoelectric drive section 30 and the second piezoelectric drive section 40 is adopted, then it is possible to achieve increased drive force (torque) by simultaneous driving of the front and rear surface piezoelectric bodies.

For example, by applying a negative voltage to the second piezoelectric drive unit 40 on the rear side, simultaneously with applying a positive voltage to the first piezoelectric drive section 30 on the front side, forces which respectively drive the diaphragm 20 in the same direction are applied by the piezoelectric drive sections (30, 40) on both the front and rear surfaces. By means of a composition of this kind, it is possible to increase the drive force yet further, and therefore a more reliable on/off switching operation can be achieved.

Further Modification Examples

The implementation of embodiments of the present invention is not limited to the piezoelectric body material, electrode material, film forming conditions, film thickness dimensions, drive voltage, and other conditions stated in the first practical example shown in FIGS. 2A to 4C and the second practical example shown in FIGS. 7A to 7D, but rather an embodiment of the present invention can be implemented under various conditions.

Moreover, in the embodiments described above, a structure is described in which a movable electrode 18 makes contact with one fixed electrode 14, but in implementing an embodiment of the present invention, it is also possible to adopt a switch structure in which a plurality of fixed electrodes (for example, a first fixed electrode and a second fixed electrode) are arranged on a base substrate, an electrical connection is established between the plurality of fixed electrodes (switch on) by means of a movable electrode making contact with the plurality of fixed electrodes, and the electrical connection between the fixed electrodes is terminated (switch off) by means of the movable electrode separating from the plurality of fixed electrodes.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric MEMS switch comprising:
   a base substrate;
   a diaphragm arranged to oppose the base substrate via a gap;
   a first piezoelectric drive section constituted by layering a first lower electrode, a first piezoelectric body and a first upper electrode on a first surface of the diaphragm, the first surface being across the diaphragm from the gap;
   a second piezoelectric drive section constituted by layering a second lower electrode, a second piezoelectric body and a second upper electrode on a second surface of the diaphragm, the second surface facing the gap;

a fixed electrode provided on a gap side of the base substrate;

a movable electrode which is fixed to a second piezoelectric drive section side of the diaphragm and opposes the fixed electrode in such a manner that the movable electrode makes contact with and separates from the fixed electrode according to displacement of the diaphragm;

a first unimorph type piezoelectric actuator, which bends the diaphragm in a direction in which the diaphragm comes close to the base substrate by operation d31 mode piezoelectric distortion of the first piezoelectric body, formed by a composition in which the first piezoelectric drive section is disposed on the first surface of the diaphragm; and a second unimorph type piezoelectric actuator, which bends the diaphragm in a direction in which the diaphragm moves away from the base substrate by operation of a d31 mode piezoelectric distortion of the second piezoelectric body, formed by a composition in which the second piezoelectric drive section is disposed on the second surface of the diaphragm, where the first piezoelectric drive section, the diaphragm, and the second piezoelectric drive section constitute a layered structure, where the second upper electrode, the second piezoelectric body, the second lower electrode, the diaphragm, the first lower electrode, the first piezoelectric body, and the first upper electrode are layered in sequence, in a direction from a near side of the base substrate to a far side of the base substrate.

2. The piezoelectric MEMS switch as defined in claim 1, wherein the first piezoelectric body and the second piezoelectric body are piezoelectric thin films deposited by a thin film forming method.

3. The piezoelectric MEMS switch as defined in claim 1, further comprising;

a drive circuit which applies a drive voltage to each of the first piezoelectric drive section and the second piezoelectric drive section, wherein a switching-on operation of displacing the diaphragm in a direction towards the base substrate so as to cause the movable electrode to make contact with the fixed electrode is performed by applying a first voltage between the first lower electrode and the first upper electrode; and a switching-off operation of displacing the diaphragm in an opposite direction to the base substrate so as to cause the movable electrode to separate from the fixed electrode is performed by applying a second voltage between the second lower electrode and the second upper electrode.

4. The piezoelectric MEMS switch as defined in claim 3, wherein the first voltage which is applied in the switching-on operation and the second voltage which is applied in the switching-off operation are voltages of a same sign.

5. The piezoelectric MEMS switch as defined in claim 4, wherein the first voltage which is applied in the switching-on operation and the second voltage which is applied in the switching-off operation are both positive voltages.

6. The piezoelectric MEMS switch as defined in claim 1, wherein the diaphragm is supported by a dual-support diaphragm structure in which both end portions of a movable region are fixed to a supporting member.

7. The piezoelectric MEMS switch as defined in claim 3, wherein the drive circuit alternately performs:

application of the first voltage between the first lower electrode and the first upper electrode, and application of the second voltage between the second lower electrode and the second upper electrode.

8. The piezoelectric MEMS switch as defined in claim 3, wherein the drive circuit does not apply the second voltage between the second lower electrode and the second upper electrode during the application of the first voltage between the first lower electrode and the first upper electrode, and the drive circuit does not apply the first voltage between the first lower electrode and the first upper electrode during the application of the second voltage between the second lower electrode and the second upper electrode.

* * * * *